US012804855B2

(12) United States Patent
Takabayashi et al.

(10) Patent No.: US 12,804,855 B2
(45) Date of Patent: Nov. 17, 2026

(54) ELECTRONIC APPARATUS

(71) Applicant: Mitsubishi Electric Corporation, Tokyo (JP)

(72) Inventors: Hirokazu Takabayashi, Tokyo (JP); Takahiro Masuyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 267 days.

(21) Appl. No.: 18/836,432

(22) PCT Filed: Apr. 13, 2022

(86) PCT No.: PCT/JP2022/017748
§ 371 (c)(1),
(2) Date: Aug. 7, 2024

(87) PCT Pub. No.: WO2023/199445
PCT Pub. Date: Oct. 19, 2023

(65) Prior Publication Data
US 2026/0122858 A1 Apr. 30, 2026

(51) Int. Cl.
*H05K 7/20* (2006.01)

(52) U.S. Cl.
CPC ..... *H05K 7/20509* (2013.01); *H05K 7/20145* (2013.01); *H05K 7/20336* (2013.01); *H05K 7/20409* (2013.01); *H05K 7/20909* (2013.01); *H05K 7/20936* (2013.01)

(58) Field of Classification Search
CPC ........... H05K 7/20509; H05K 7/20145; H05K 7/20336; H05K 7/20409; H05K 7/20909; H05K 7/20936
USPC ........................................................ 361/704
See application file for complete search history.

(56) References Cited

U.S. PATENT DOCUMENTS 9,087,814 B2 * 7/2015 Liao .................... F28D 15/0233
2010/0096107 A1 * 4/2010 Lian .................... F28D 15/0233 165/80.3
2013/0120937 A1 * 5/2013 Liao .................... F28D 15/0233 361/700

(Continued)

FOREIGN PATENT DOCUMENTS

JP 2000092819 A 3/2000
JP 2017112690 A 6/2017

(Continued)

OTHER PUBLICATIONS

International Search Report (PCT/ISA/210) with translation and Written Opinion (PCT/ISA/237) mailed on Jul. 5, 2022, by the Japanese Patent Office as the International Searching Authority for International Application No. PCT/JP2022/017748. (9 pages).

(Continued)

*Primary Examiner* — Zhengfu J Feng
(74) *Attorney, Agent, or Firm* — Buchanan Ingersoll & Rooney PC

(57) ABSTRACT

An electronic device includes a base and heat dissipation members. Electronic components in a first central portion of the base have a greater amount of total heat generation than electronic components in first end portions. Heat dissipation members attached to a second central portion of the base have a larger total surface area than heat dissipation members attached to second end portions.

13 Claims, 9 Drawing Sheets

(56) References Cited

U.S. PATENT DOCUMENTS

| | | | | |
|---|---|---|---|---|
| 2015/0216074 | A1* | 7/2015 | Nishihara | H05K 7/2039<br>361/704 |
| 2020/0243420 | A1* | 7/2020 | Xiao | F28D 15/00 |
| 2022/0272877 | A1 | 8/2022 | Nakashima | |
| 2023/0073236 | A1 | 3/2023 | Takabayashi | |

FOREIGN PATENT DOCUMENTS

| | | | | |
|---|---|---|---|---|
| WO | WO-2021019642 | A1 * | 2/2021 | H02M 7/003 |
| WO | WO-2021199252 | A1 * | 10/2021 | H05K 7/20936 |

OTHER PUBLICATIONS

Notice of Reasons for Refusal with translation dated Jun. 11, 2024 issued by the Japanese Patent Office in corresponding Japanese Patent Application No. 2024-515248. (12 pages).
Extended European Search Report dated May 7, 2025, issued in the corresponding European Patent Application No. 22937424.4, 11 pages.

* cited by examiner

ELECTRONIC APPARATUS

TECHNICAL FIELD

The present disclosure relates to an electronic device.

BACKGROUND ART

An electronic device, such as a power converter, installed on a railway vehicle dissipates heat generated by electronic components with a cooler to passing air created by the traveling vehicle to cool the electronic components. Patent Literature 1 describes an example of such an electronic device. The power converter described in Patent Literature 1 cools electronic components, such as semiconductor elements accommodated inside the housing of the power converter, by causing passing air generated during the travel of the railway vehicles to flow between the coolers.

CITATION LIST

Patent Literature

Patent Literature 1: Unexamined Japanese Patent Application Publication No. 2017-112690

SUMMARY OF INVENTION

Technical Problem

In the power converter described in Patent Literature 1, semiconductor elements to be cooled are mounted at equal intervals on one main surface of the base. To install the power converter on a roof of a railway vehicle, the vertical length of a cooler at an end of the railway vehicle in the width direction is to be shorter than the vertical length of the cooler at the center of the railway vehicle in the width direction, depending on the vehicle limit of the railway vehicle. This causes the cooler to have lower cooling performance at an end of the railway vehicle in the width direction than at the center of the railway vehicle in the width direction. Thus, when the power converter described in Patent Literature 1 is installed on the roof, the electronic components mounted on the base at the end of the railway vehicle in the width direction are not cooled sufficiently.

Under such circumstances, an objective of the present disclosure is to provide an electronic device with high performance in cooling electronic components.

Solution to Problem

To achieve the above objective, an electronic device according to an aspect of the present disclosure includes a housing, a base being heat-transferable, and a plurality of heat dissipation members. The housing is installable on a roof of a vehicle. The housing has an opening in a vertically upper portion of the housing and accommodates a plurality of electronic components that generate heat when energized. The base has a first main surface on which the plurality of electronic components are mounted. The base is attached to the housing with the first main surface covering the opening in the housing. The plurality of heat dissipation members are attached to a second main surface of the base opposite to the first main surface to dissipate, into ambient air, heat transferred from the plurality of electronic components through the base. The plurality of electronic components include electronic components mounted in a first central portion of the first main surface and electronic components mounted in first end portions of the first main surface. The first central portion has a distance greater than or equal to a first threshold to a vehicle limit on the roof of the vehicle. The first end portions are located with the first central portion between the first end portions in a width direction and have a distance less than the first threshold to the vehicle limit. The electronic components in the first central portion have a greater amount of total heat generation than the electronic components in the first end portions. The plurality of heat dissipation members include heat dissipation members attached to a second central portion of the second main surface and heat dissipation members attached to second end portions of the second main surface. The second central portion has a distance greater than or equal to a second threshold to the vehicle limit. The second end portions are located with the second central portion between the second end portions in the width direction and have a distance less than the second threshold to the vehicle limit. The heat dissipation members attached to the second central portion have a larger total surface area than the heat dissipation members attached to the second end portions.

Advantageous Effects of Invention

The electronic device according to the above aspect of the present disclosure has a greater amount of total heat generation of the electronic components in the first central portion than in the first end portions. The heat dissipation members in the second central portion have a larger total surface area than the heat dissipation members in the second end portions. The resultant electronic device thus has high performance in cooling the electronic components.

DESCRIPTION OF EMBODIMENTS

Figure 1:
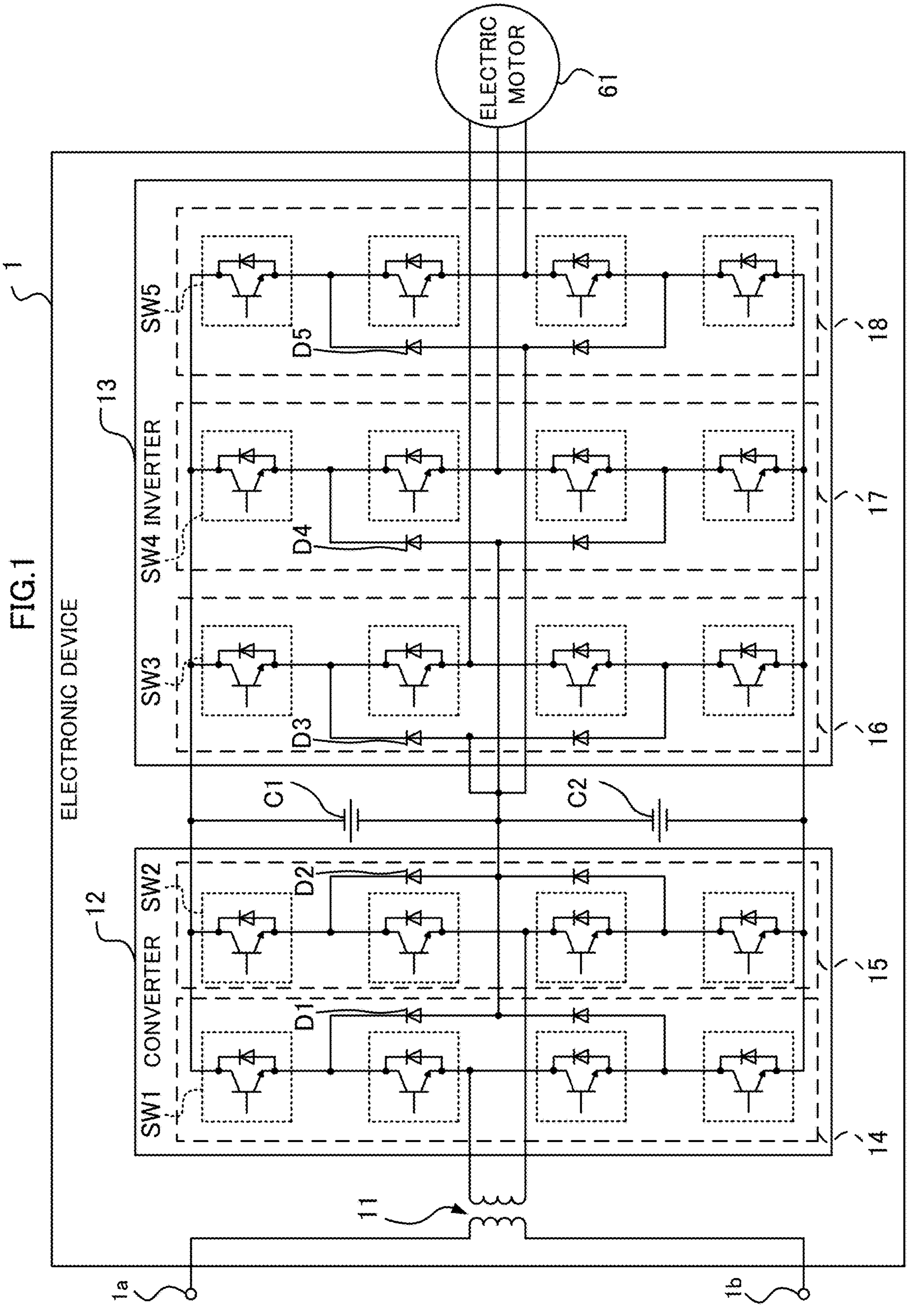
FIG. 1 is a block diagram of an electronic device according to an embodiment.

An electronic device according to one or more embodiments of the present disclosure is described below in detail with reference to the drawings. Like reference signs denote like or corresponding components in the drawings.

An example of an electronic device is a power converter installable on a railway vehicle to convert alternating current (AC) power supplied from an AC power supply to AC power to be supplied to a load and supply the resulting AC power to the load. An electronic device 1 according to one or more embodiments described below is installed on a roof of a railway vehicle and cools electronic components using passing air as airflow moving in the direction opposite to the travel direction of the railway, and natural convection. The passing air results from the travel of the railway vehicle.

The electronic device 1 illustrated in FIG. 1 is installed on an AC feeding railway vehicle and converts supplied AC power to AC power suitable for an electric motor 61 that is an example of a load, and supplies the resulting AC power to the electric motor 61. The electric motor 61 is, for example, a three-phase induction motor that generates propulsion of the railway vehicle. When the electronic device 1 supplies power to the electric motor 61 during traveling of the railway vehicle, or more specifically, during power running, the electric motor 61 generates propulsion of the railway vehicle.

The components of the electronic device 1 are described below. The electronic device 1 includes an input terminal 1*a* connected to the power supply and an input terminal 1*b* grounded. The electronic device 1 further includes a transformer 11 that lowers the voltage of AC power supplied from the power supply connected to the input terminal 1*a*, a converter 12 that converts the AC power having the voltage lowered by the transformer 11 to DC power, capacitors C1 and C2 that are charged with the DC power output from the converter 12, and an inverter 13 that converts the DC power input through the capacitors C1 and C2 to AC power.

The input terminal 1*a* is electrically connected to, for example, a current collector that acquires AC power supplied from an electrical substation through a power line. For example, the power line is an overhead power line or a third rail. The current collector is, for example, a pantograph or a collector shoe. The input terminal 1*b* is short-circuited to rails through, for example, a ground brush, a ground ring, or a wheel, which are not illustrated, and is grounded.

The transformer 11 includes a primary winding having one end connected to the input terminal 1*a* and the other end connected to the input terminal 1*b*, and a secondary winding connected to the converter 12. For example, the transformer 11 lowers single-phase AC power with a voltage of 25 kV supplied from the current collector to single-phase AC power with a voltage of 1520 V, and supplies the AC power with the lowered voltage to the converter 12.

The converter 12 includes four switching elements SW1 connected in series and two diodes D1 connected in series. The two diodes D1 are connected in parallel to the central two of the four switching elements SW1. A circuit including the four switching elements SW1 and the two diodes D1 is a U-phase circuit 14.

The converter 12 further includes four switching elements SW2 connected in series and two diodes D2 connected in series. The two diodes D2 are connected in parallel to the central two of the four switching elements SW2. A circuit including the four switching elements SW2 and the two diodes D2 is a V-phase circuit 15.

The four switching elements SW1 and the four switching elements SW2 are connected in parallel to one another. The secondary winding of the transformer 11 has one end connected to the connection point between the two central switching elements SW1, and the other end connected to the connection point between the two central switching elements SW2.

One of the two diodes D1 has the cathode connected to the connection point between the two switching elements SW1 corresponding to an upper arm of the U-phase circuit 14. One of the two diodes D1 has the anode connected to the cathode of the other diode D1. The other diode D1 has the anode connected to the connection point between the two switching elements SW1 corresponding to a lower arm of the U-phase circuit 14.

One of the two diodes D2 has the cathode connected to the connection point between the two switching elements SW2 corresponding to an upper arm of the V-phase circuit 15. One of the two diodes D2 has the anode connected to the cathode of the other diode D2. The other diode D2 has the anode connected to the connection point between the two switching elements SW2 corresponding to a lower arm of the V-phase circuit 15.

The connection point between the two diodes D1 and the connection point between the two diodes D2 are each connected to the connection point between the capacitors C1 and C2.

Each of the switching elements SW1 and SW2 includes, for example, an insulated gate bipolar transistor (IGBT) and a reflux diode having the anode connected to the emitter terminal of the IGBT and the cathode connected to the collector terminal of the IGBT. A gate signal from a non-illustrated controller is provided to the gate terminals of the IGBTs included in the switching elements SW1 and SW2 in the converter 12 to control turning on and off of the IGBTs, in other words, turning on and off of the switching elements SW1 and SW2. The switching operation of each of the switching elements SW1 and SW2 causes the converter 12 to convert AC power supplied from the transformer 11 to DC power.

The capacitors C1 and C2 are connected in series and are chargeable with DC power output from the converter 12.

The inverter 13 includes four switching elements SW3 connected in series and two diodes D3 connected in series. The two diodes D3 are connected in parallel to the central two of the four switching elements SW3. A circuit including the four switching elements SW3 and the two diodes D3 is a U-phase circuit 16.

The inverter 13 further includes four switching elements SW4 connected in series and two diodes D4 connected in series. The two diodes D4 are connected in parallel to the central two of the four switching elements SW4. A circuit including the four switching elements SW4 and the two diodes D4 is a V-phase circuit 17.

The inverter 13 further includes four switching elements SW5 connected in series and two diodes D5 connected in series. The two diodes D5 are connected in parallel to the central two of the four switching elements SW5. A circuit including the four switching elements SW5 and the two diodes D5 is a W-phase circuit 18.

Each of the switching elements SW3, SW4, and SW5 has the same configuration as the switching elements SW1 and SW2. A gate signal from a non-illustrated controller is provided to the gate terminals of the IGBTs included in the switching elements SW3, SW4, and SW5 in the inverter 13 to control turning on and off of the IGBTs, in other words, turning on and off of the switching elements SW3, SW4, and SW5. The switching operation of each of the switching elements SW3, SW4, and SW5 causes the inverter 13 to convert DC power to three-phase AC power and supply the three-phase AC power to the electric motor 61.

The four switching elements SW3, the four switching elements SW4, and the four switching elements SW5 are connected in parallel to one another. The connection point between the two central switching elements SW3, the connection point between the two central switching elements SW4, and the connection point between the two central switching elements SW5 are each connected to the electric motor 61.

One of the two diodes D3 has the cathode connected to the connection point between the two switching elements SW3 corresponding to an upper arm of the U-phase circuit 16. One of the two diodes D3 has the anode connected to the cathode of the other diode D3. The other diode D3 has the anode connected to the connection point between the two switching elements SW3 corresponding to a lower arm of the U-phase circuit 16.

One of the two diodes D4 has the cathode connected to the connection point between the two switching elements SW4 corresponding to an upper arm of the V-phase circuit 17. One of the two diodes D4 has the anode connected to the cathode of the other diode D4. The other diode D4 has the anode connected to the connection point between the two switching elements SW4 corresponding to a lower arm of the V-phase circuit 17.

One of the two diodes D5 has the cathode connected to the connection point between the two switching elements SW5 corresponding to an upper arm of the W-phase circuit 18. One of the two diodes D5 has the anode connected to the cathode of the other diode D5. The other diode D5 has the anode connected to the connection point between the two switching elements SW5 corresponding to a lower arm of the W-phase circuit 18.

The connection point between the two diodes D3, the connection point between the two diodes D4, and the connection point between the two diodes D5 are each connected to the connection point between the capacitors C1 and C2.

While the railway vehicle is traveling, the converter 12 and the inverter 13 are operating. In this state, the switching elements SW1, SW2, SW3, SW4, and SW5 repeatedly turn on and off and thus each perform a switching operation that generates heat. During the operation of the converter 12 and the inverter 13, an electrical current flows through the diodes D1, D2, D3, D4, and D5, causing the diodes D1, D2, D3, D4, and D5 to generate heat. Thus, the electronic device 1 cools the electronic components including the switching elements SW1, SW2, SW3, SW4, and SW5 and the diodes D1, D2, D3, D4, and D5 using passing air when the railway vehicle is traveling, and cools the electronic components including the switching elements SW1, SW2, SW3, SW4 and SW5 and the diodes D1, D2, D3, D4, and D5 using natural convection when the railway vehicle is stopped.

Figure 2:
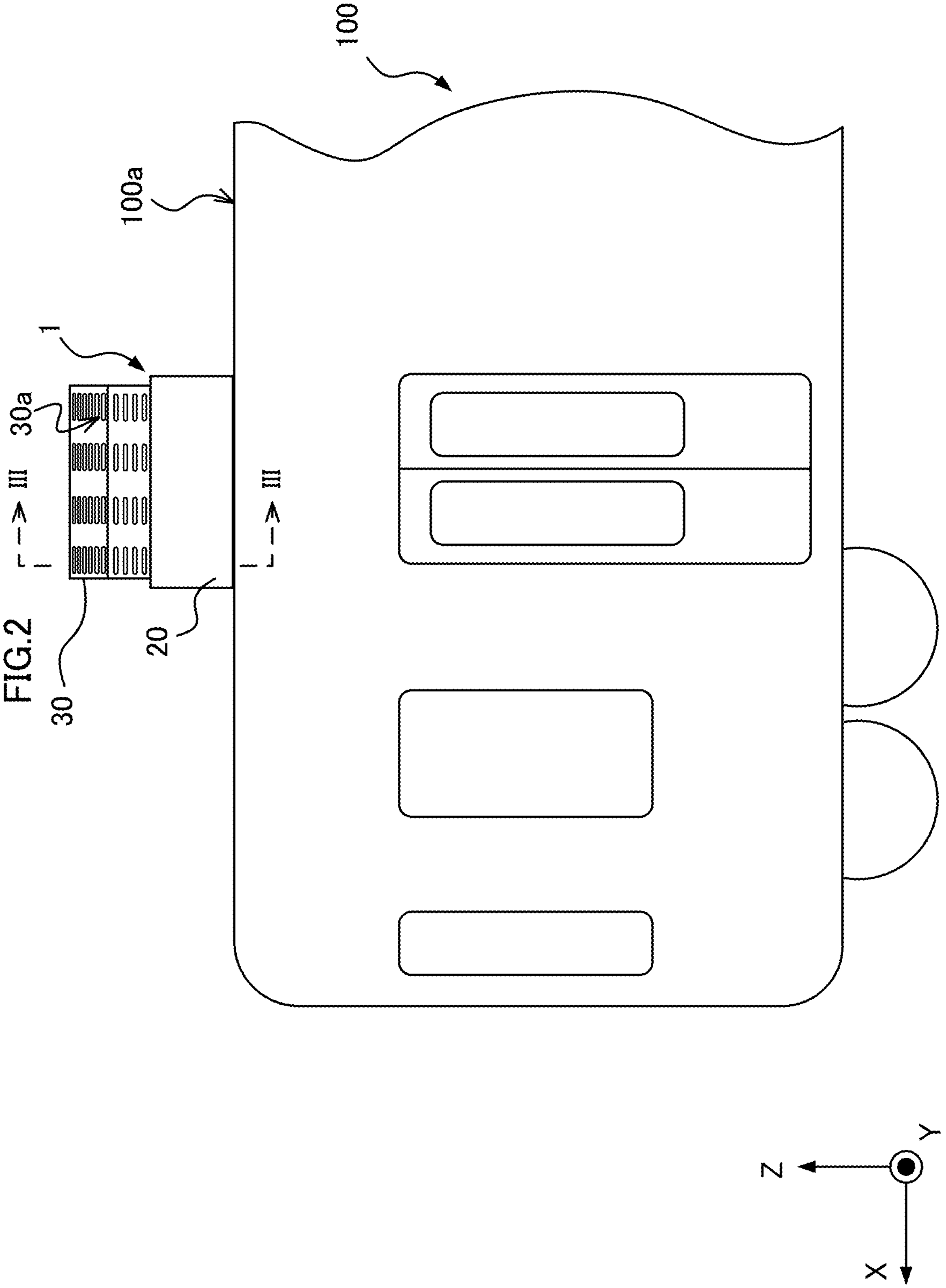
FIG. 2 is a diagram of the electronic device according to the embodiment, illustrating example installation on a vehicle.
Figure 3:
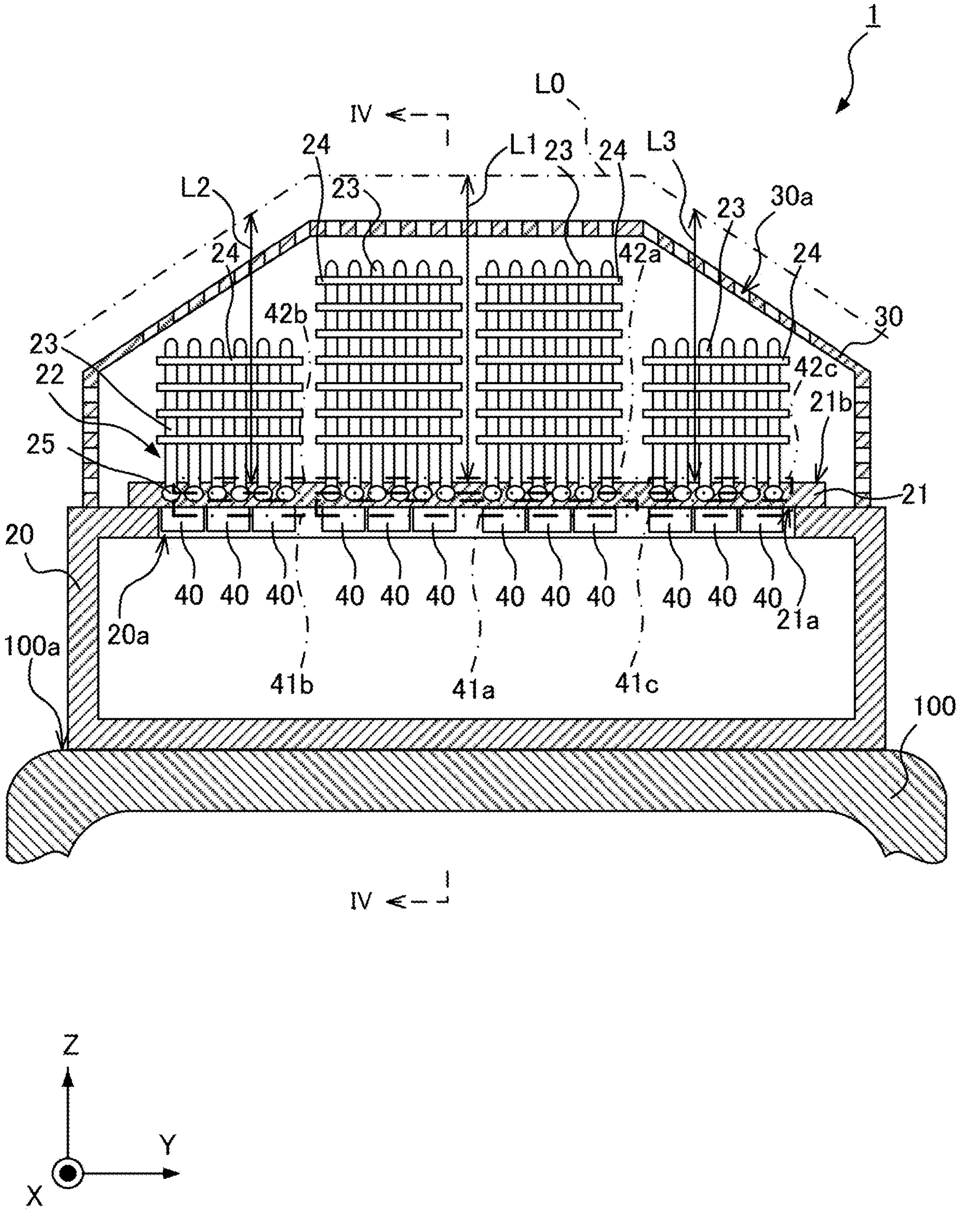
FIG. 3 is a cross-sectional view of the electronic device according to the embodiment taken along line III-III in FIG. 2 as viewed in the direction indicated by the arrows.

The structure of the electronic device 1 is described in detail below. As illustrated in FIG. 2, the electronic device 1 is installed on a roof 100*a* of a vehicle 100. As illustrated in FIG. 3 that is a cross-sectional view taken along III-III line in FIG. 2, the electronic device 1 is installed on the roof 100*a* and includes a housing 20 accommodating electronic components 40 including the switching elements SW1, SW2, SW3, SW4, and SW5, and the diodes D1, D2, D3, D4, and D5. The electronic device 1 further includes a heat-transferable base 21 attached to the housing 20 to cover an opening 20*a* of the housing 20. The base 21 has a first main surface 21*a* on which the electronic components 40 are mounted. The electronic device 1 further includes multiple heat dissipation members 22 that are attached to a second main surface 21*b* of the base 21 to dissipate heat transferred from the electronic components 40 through the base 21 into ambient air.

The electronic device 1 includes, as the multiple heat dissipation members 22, multiple first heat transfer members 23 attached to the second main surface 21*b* and extending away from the second main surface 21*b*, and multiple fins 24 attached to the multiple first heat transfer members 23.

To suppress damage to the heat dissipation members 22, or more specifically, to the first heat transfer members 23 and the fins 24, the electronic device 1 preferably further includes a cover 30 attached to the housing 20 to cover the first heat transfer members 23 and the fins 24. The electronic device 1 preferably further includes multiple second heat transfer members 25 that are attached to the base 21 to reduce variations in the performance in cooling the electronic components 40.

In FIGS. 2 and 3, the Z-axis indicates the vertical direction with the vehicle 100 located horizontally. The X-axis indicates the travel direction of the vehicle 100. The Y-axis indicates the width direction of the vehicle 100. The X-axis, Y-axis, and Z-axis are perpendicular to one another. The same applies to the subsequent figures.

The housing 20 is attached to a vertically upper portion of the roof 100*a*. The housing 20 has rigidity and strength to resist deformation under the maximum expected vibration from the railway vehicle. For example, the housing 20 is formed of metal such as iron or aluminum. The housing 20 has the opening 20*a* in a vertically upper portion. The housing 20 accommodates the multiple electronic components 40 that generate heat when energized.

The base 21 is attached to the housing 20 with the first main surface 21*a* covering the opening 20*a*. In the embodiment, the base 21 is a flat plate of a material with high thermal conductivity, for example, metal such as iron or aluminum, fine ceramics, or graphite, and is attached to the outer surface of the housing 20. The base 21 has the first main surface 21*a* on which the heat-generating electronic components 40, or more specifically, the switching elements SW1, SW2, SW3, SW4, and SW5 and the diodes D1, D2, D3, D4, and D5 are mounted. The multiple heat dissipation members 22 are attached to the second main surface 21*b* opposite to the first main surface 21*a*. With the vehicle 100 located horizontally, the first main surface 21*a* and the second main surface 21*b* extend horizontally.

The first heat transfer members 23 included in each heat dissipation member 22 are attached to the second main surface 21*b*, extend away from the second main surface 21*b*, and transfer heat away from the second main surface 21*b*. Each first heat transfer member 23 transfers heat to ambient air and to the fins 24 attached to the first heat transfer member 23.

Figure 4:
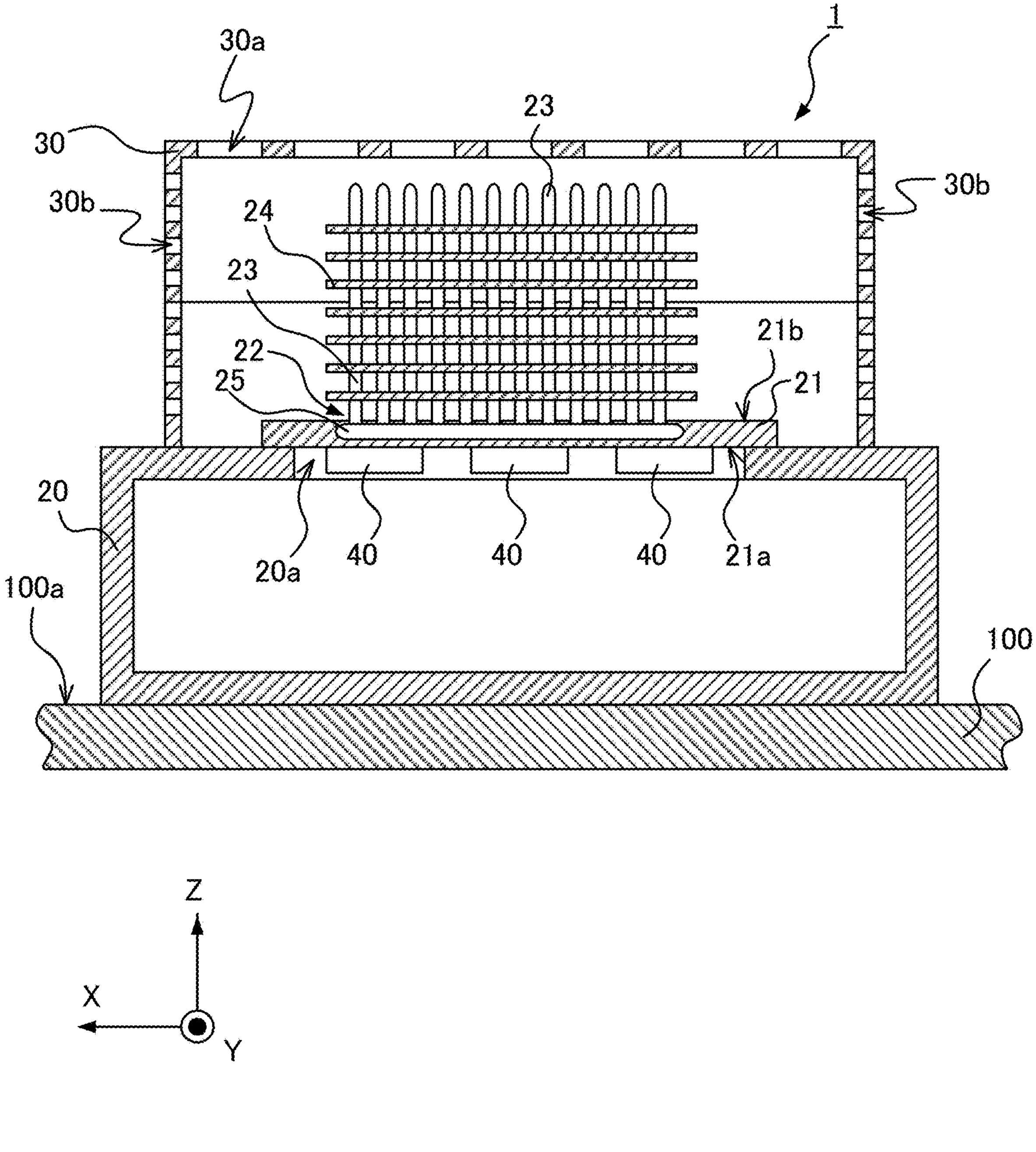
FIG. 4 is a cross-sectional view of the electronic device according to the embodiment taken along line IV-IV in FIG. 3 as viewed in the direction indicated by the arrows.

As illustrated in FIG. 3 and FIG. 4 that is a cross-sectional view taken along line IV-IV in FIG. 3 as viewed in the direction indicated by the arrows, the multiple first heat transfer members 23 extending in the Z-axis direction are arranged in the X-axis direction and Y-axis direction. Each first heat transfer member 23 is attached to the second main surface 21*b* with an attaching method such as welding, or soldering. Each first heat transfer member 23 is a heat pipe of a material with high thermal conductivity, for example, metal such as iron or aluminum.

As illustrated in FIG. 3, the length of the first heat transfer member 23 in the Z-axis direction is set to a length included in a vehicle limit L0 in a cross section perpendicular to the travel direction of the vehicle 100, in other words, the YZ plane. In the YZ plane, the vehicle limit L0 is indicated by multiple line segments. The vehicle limit L0 indicates the maximum dimensions of the vehicle 100. In the embodiment, the length of the first heat transfer member 23 in the Z-axis direction differs depending on the vehicle limit L0. More specifically, the first heat transfer members 23 located at each end in the Y-axis direction are shorter in the Z-axis direction than the first heat transfer members 23 located at the center in the Y-axis direction.

The fins 24 in the heat dissipation members 22 are attached to the multiple first heat transfer members 23 with the main surfaces extending along the second main surface 21*b*. More specifically, the fins 24 are attached to the multiple first heat transfer members 23, with the first heat transfer members 23 placed through through-holes in the fins 24. The fins 24 attached to the first heat transfer members 23 dissipate heat transferred from the electronic components through the base 21 and the first heat transfer members 23 into ambient air. In the embodiment, each fin 24 is a flat plate of a material with high thermal conductivity, for example, metal such as iron or aluminum, fine ceramics, or graphite. With the vehicle 100 located horizontally, main surfaces of the fins 24 extend horizontally.

To improve the performance in cooling the electronic components 40 when the vehicle 100 is traveling, the main surfaces of the fins 24 is preferably parallel to the X-axis. With passing air generated during the travel of the vehicle 100 flowing in the X-axis direction, the main surfaces of the fins 24 parallel to the X-axis allow heat to be efficiently transferred from the fins 24 to the passing air flowing between the fins 24. Thus, the electronic components 40 can be cooled efficiently.

The multiple second heat transfer members 25 extending in the X-axis direction are arranged in the Y-axis direction. Each second heat transfer member 25 is embedded in the base 21. Each second heat transfer member 25 is a heat pipe of a material with high thermal conductivity, for example, metal such as iron or aluminum. The multiple first heat transfer members 23 are attached and connected to the respective second heat transfer members 25. A coolant in a gas-liquid two-phase state at normal temperature is enclosed in the first heat transfer members 23 and the second heat transfer members 25. An example of the coolant is water.

When the vehicle 100 is traveling, passing air heated with heat transferred from the fins 24 at the front in the travel direction of the vehicle 100 flows rearward in the travel direction of the vehicle 100. Thus, in the electronic device 1, the electronic components 40 located at the rear in the travel direction of the vehicle 100 may be cooled less sufficiently than the electronic components 40 located at the front in the travel direction of the vehicle 100. The second heat transfer members 25 extending in the X-axis direction as described above and the convection of the coolant inside the second heat transfer members 25 cause heat distribution in the X-axis direction, thus reducing variations in cooling the electronic components 40 that are arranged in the X-axis direction.

The cover 30 is attached to the housing 20 to cover the base 21 and the heat dissipation members 22. The cover 30 has multiple vents 30*a* in a surface extending along the X-axis. The vents 30*a* allow outside air to flow into the cover 30, and allow air flowing near the heat dissipation members 22 and the fins 24 to flow out of the cover 30. As illustrated in FIG. 4, the cover 30 has multiple vents 30*b* in surfaces perpendicular to the X-axis. The vents 30*b* allow outside air to flow into the cover 30, and allow air flowing near the first heat transfer members 23 and the fins 24 to flow out of the cover 30.

Cooling of the electronic components 40 in the electronic device 1 with the above structure is described below. Heat generated by the electronic components 40 is transferred to the coolant through the base 21 and the second heat transfer members 25. The coolant thus vaporizes. The vaporized coolant flows from the second heat transfer members 25 into the first heat transfer members 23 and moves inside the first heat transfer members 23 in the positive Z-axis direction. The coolant transfers heat to ambient air around the heat dissipation members 22 through the first heat transfer members 23 and the fins 24 while moving in the positive Z-axis direction, and is cooled and liquefies. The liquefied coolant moves along the inner walls of the first heat transfer members 23 in the negative Z-axis direction and returns to the second heat transfer members 25. As the coolant circulates while repeatedly vaporizing and liquefying as described above, the heat generated by the electronic components 40 is transferred to ambient air around the heat dissipation members 22, thus cooling the electronic components 40 that are generating heat.

For example, passing air flowing in the negative X-axis direction occurs when the vehicle 100 travels in the positive X-axis direction. The passing air flows inside the cover 30 through the vents 30*b* illustrated in FIG. 4, passes between the fins 24, and flows out of the cover 30 through the vents 30*b*. As the passing air passes between the fins 24, heat is transferred from the fins 24 to the passing air to cool the electronic components 40.

When the vehicle 100 is stopped, no passing air occurs. The air inside the cover 30 is heated with the heat transferred from the fins 24, flows along the fins 24, and moves vertically upward between the fins 24. The air moving vertically upward flows out of the cover 30 through the vents 30*a* in a vertically upper portion of the cover 30 illustrated in FIG. 3. When the air inside the cover 30 flows out through the vents 30*a*, air outside the cover 30 flows inside the cover 30 through the vents 30*a* and 30*b*, as illustrated in FIGS. 3 and 4. Natural convection can thus be used to cool the electronic components 40 also when the vehicle 100 is stopped.

Figure 5:
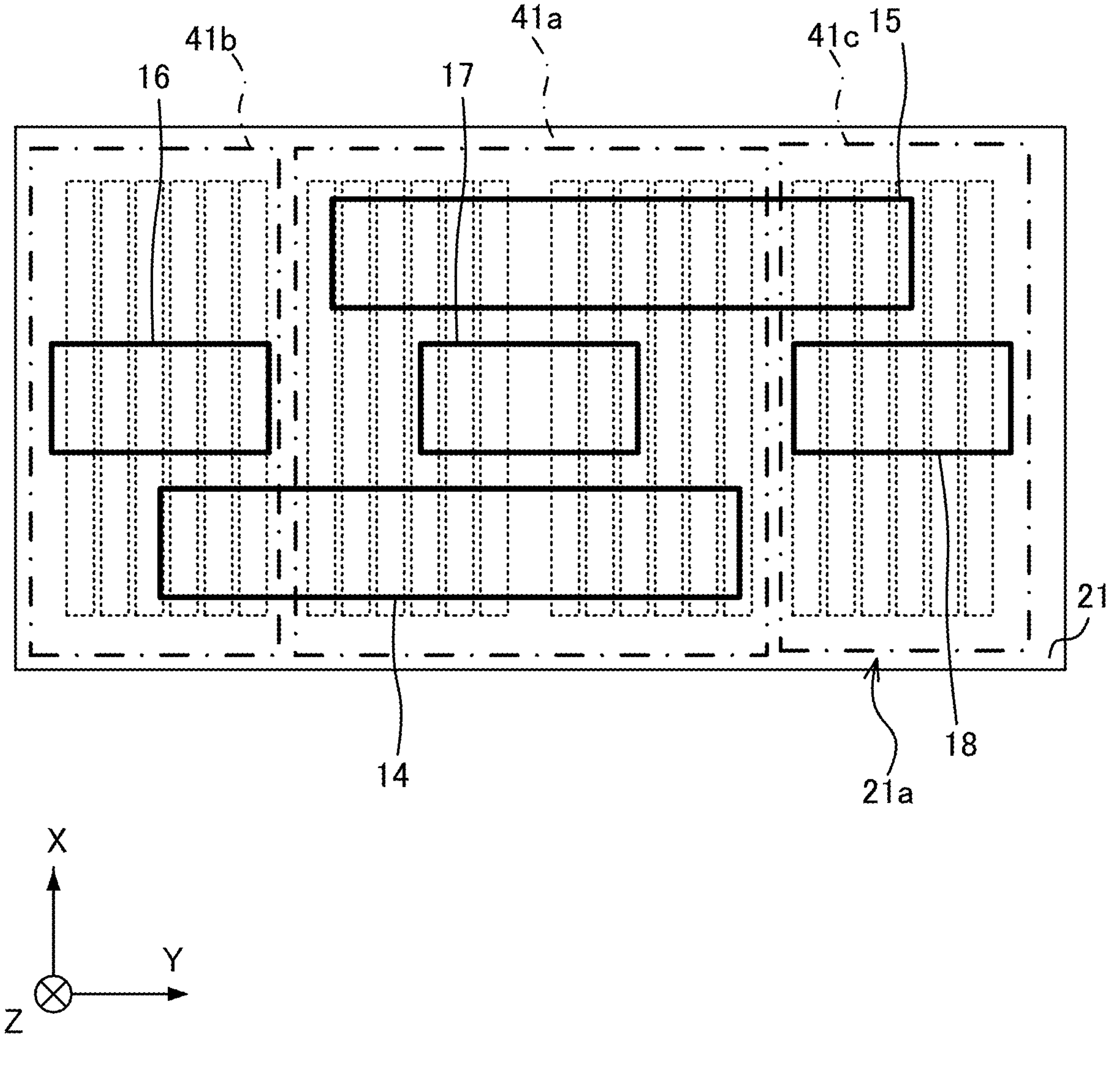
FIG. 5 is a diagram of electronic components, illustrating an example arrangement on a base in the embodiment.

The structure of the electronic device 1 for efficiently cooling the electronic components 40 is described below. As illustrated in FIGS. 3 and 5, the first main surface 21*a* of the base 21 is divided into a first central portion 41*a* including the center of the first main surface 21*a* in the Y-axis direction and extending in the X-axis direction, and first end portions 41*b* and 41*c* located with the first central portion 41*a* between the first end portions 41*b* and 41*c* in the Y-axis direction. The first end portions 41*b* and 41*c* include the ends of the first main surface 21*a* in the Y-axis direction and extend in the X-axis direction.

More specifically, the first main surface 21*a* has an area with the distance to the vehicle limit L0 on the roof greater than a first threshold as the first central portion 41*a*, and areas with the distance to the vehicle limit L0 less than the first threshold as the first end portions 41*b* and 41*c*. The first threshold is, for example, the distance from the first main surface 21*a* to the vehicle limit L0 at a position shifted from the end of the first main surface 21*a* toward the center of the base 21 in the width direction of the vehicle 100 by one-fourth of the length of the base 21 in the width direction.

In the embodiment, the first central portion 41*a* has an area substantially equal to the total area of the first end portions 41*b* and 41*c*. The areas being substantially equal to each other refers to the areas with the area ratio of 0.95 to 1.05 inclusive.

As illustrated in FIG. 3, the first central portion 41*a* has a distance L1 from the first main surface 21*a* to the vehicle limit L0 greater than both a distance L2 from the first main surface 21*a* to the vehicle limit L0 in the first end portion 41*b* and a distance L3 from the first main surface 21*a* to the vehicle limit L0 in the first end portion 41*c*.

Figure 6:
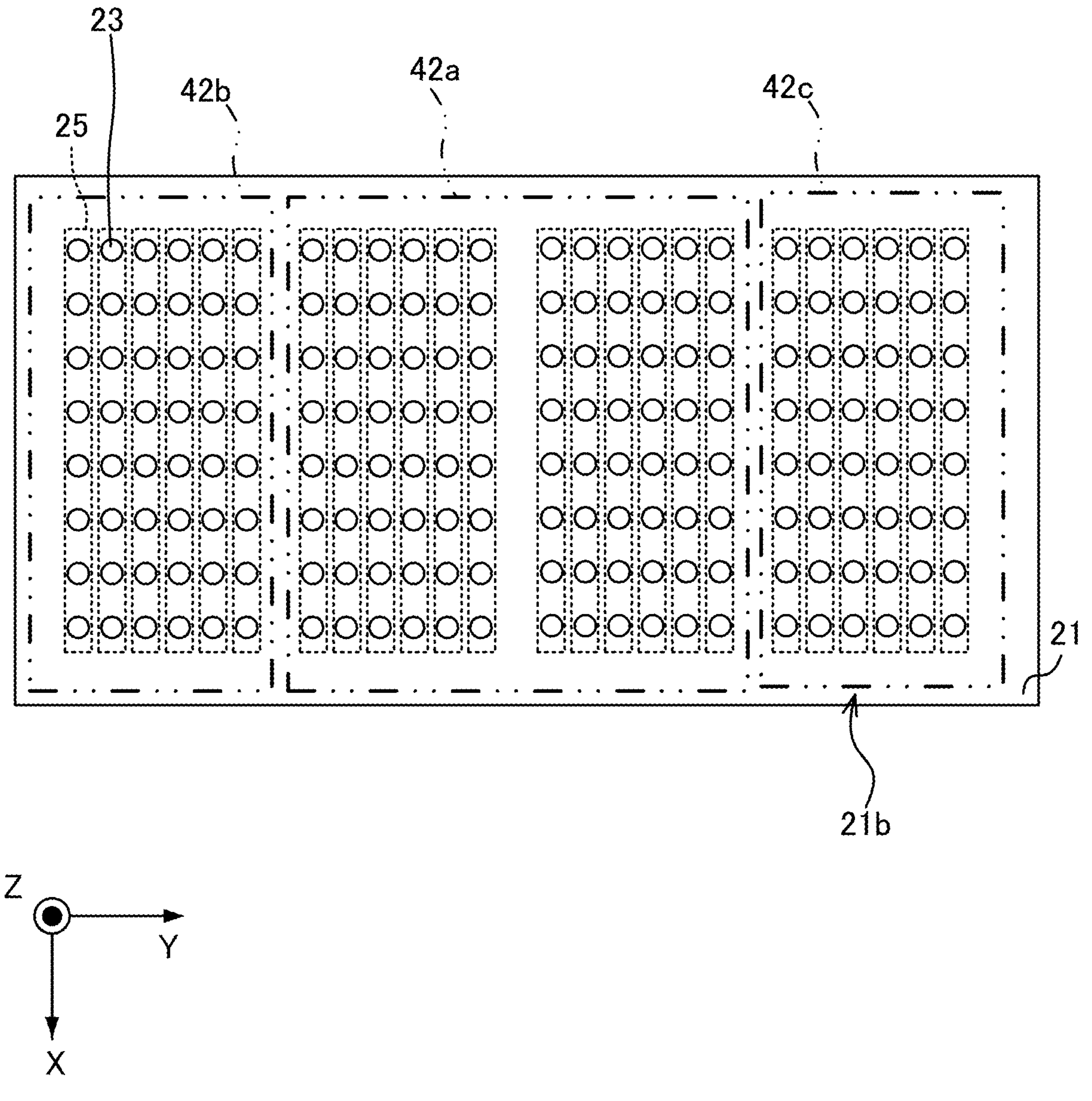
FIG. 6 is a top view of the base in the embodiment.

As illustrated in FIGS. 3 and 6, the second main surface 21*b* of the base 21 is divided into a second central portion 42*a* including the center of the second main surface 21*b* in the Y-axis direction and extending in the X-axis direction, and second end portions 42*b* and 42*c* located with the second central portion 42*a* between the second end portions 42*b* and 42*c* in the Y-axis direction. The second end portions 42*b* and 42*c* include the ends of the second main surface 21*b* in the Y-axis direction and extend in the X-axis direction. For simplicity, the fins 24 are not illustrated in FIG. 6.

More specifically, the second main surface 21*b* has an area with the distance to the vehicle limit L0 greater than a second threshold as the second central portion 42*a*, and areas with the distance to the vehicle limit L0 less than the second threshold as the second end portions 42*b* and 42*c*. The second threshold is, for example, the distance from the second main surface 21*b* to the vehicle limit L0 at a position shifted from the end of the second main surface 21*b* toward the center of the base 21 in the width direction of the vehicle 100 by one-fourth of the length of the base 21 in the width direction.

In the embodiment, the second central portion 42*a* has an area substantially equal to the total area of the second end portions 42*b* and 42*c*. As illustrated in FIG. 3, the second central portion 42*a* is located opposite to the first central portion 41*a* with respect to the base 21. Similarly, the second end portions 42*b* and 42*c* are located opposite to the respective first end portions 41*b* and 41*c* with respect to the base 21. For example, the second central portion 42*a* has an area substantially equal to the area of the first central portion 41*a*, and the second end portions 42*b* and 42*c* have areas substantially equal to the areas of the respective first end portions 41*b* and 41*c*.

The heat dissipation members 22 attached to the second central portion 42*a* have a larger total surface area than the heat dissipation members 22 attached to the second end portions 42*b* and 42*c*. More specifically, the first heat transfer members 23 attached to the second central portions 42*a* and the fins 24 attached to the first heat transfer members 23 have a larger total surface area than the first heat transfer members 23 attached to the second end portions 42*b* and 42*c* and the fins 24 attached to the first heat transfer members 23.

In the embodiment, the first heat transfer members 23 in the second central portion 42*a* are longer in the Z-axis direction than the first heat transfer members 23 in the second end portions 42*b* and 42*c*. More fins 24 are attached to the first heat transfer members 23 in the second central portions 42*a* than to the first heat transfer members 23 in the second end portions 42*b* and 42*c*.

Thus, the heat dissipation members 22 in the second central portion 42*a* have a larger surface area than the heat dissipation members 22 in the second end portions 42*b* and 42*c*. Thus, the heat dissipation members 22 in the second central portion 42*a* has higher cooling performance than the heat dissipation members 22 in the second end portions 42*b* and 42*c*.

The electronic components 40 mounted in the first central portion 41*a* are arranged to have a greater amount of total heat generation than the electronic components 40 mounted in the first end portions 41*b* and 41*c*. FIG. 5 illustrates an example arrangement of the electronic components 40, or more specifically, the U-phase circuit 14, the V-phase circuit 15, the U-phase circuit 16, the V-phase circuit 17, and the W-phase circuit 18.

More specifically, the components of the U-phase circuit 14 and the V-phase circuit 15 in the converter 12 are mounted in the first central portion 41*a* to have the components of the V-phase circuit 17 in the inverter 13 between the components of the U-phase circuit 14 and the V-phase circuit 15 in the X-axis direction. Some components of the U-phase circuit 14 are mounted adjacent to some components of the U-phase circuit 16 in the X-axis direction on the first main surface 21*a* in the first end portion 41*b*. Some components of the V-phase circuit 15 are mounted adjacent to some components of the W-phase circuit 18 in the X-axis direction in the first end portion 41*c*.

In the above arrangement, more electronic components 40 are mounted in the first central portion 41*a* than in the first end portions 41*b* and 41*c*. Thus, the electronic components 40 mounted in the first central portion 41*a* has a greater amount of total heat generation than the electronic components 40 mounted in the first end portions 41*b* and 41*c*.

An electrical current constantly flows in the two central switching elements SW1 in the U-phase circuit 14 when the converter 12 is operating. Thus, the two central switching elements SW1 in the U-phase circuit 14 are preferably mounted in the first central portion 41*a*. Similarly, an electrical current constantly flows in the two central switching elements SW2 in the V-phase circuit 15 when the converter 12 is operating. Thus, the two central switching elements SW2 in the V-phase circuit 15 are preferably mounted in the first central portion 41*a*.

The electronic components 40 mounted in the first central portion 41*a* corresponding to the second central portion 42*a* with the heat dissipation members 22 having high cooling performance generate more heat to maximize the cooling performance of the heat dissipation members 22 to cool the electronic components 40.

The electronic components 40 may generate more heat at different times. When the electronic components 40 start generating more heat at different times, more heat may be transferred to some first heat transfer members 23 and less heat may be transferred to other first heat transfer members 23. The multiple electronic components 40 may include multiple first electronic components, and multiple second electronic components that generate more heat at different times from any of the first electronic components. For example, the multiple first electronic components include the components of the U-phase circuit 14 and the V-phase circuit 15 in the converter 12, or more specifically, the switching elements SW1 and SW2 and the diodes D1 and D2. The second electronic components include the components of the U-phase circuit 16, the V-phase circuit 17, and the W-phase circuit 18 in the inverter 13, or more specifically, the switching elements SW3, SW4, and SW5 and the diodes D3, D4, and D5.

The components of the converter 12 and the components of the inverter 13 start generating more heat at different times. More specifically, with the electric motor 61 under constant torque control from when the vehicle 100 starts accelerating to when the vehicle 100 reaches a threshold speed, the power to be used increases in proportion to the speed of the vehicle 100. Thus, the loss in the converter 12 gradually increases as the speed of the vehicle 100 increases. When the vehicle 100 reaches the threshold speed, the electric motor 61 is under constant power control. The power to be used is thus substantially constant independently of the speed. Thus, the loss in the converter 12 reaches the maximum when the speed of the vehicle 100 reaches the threshold speed and is substantially constant at the maximum at the speed of the vehicle 100 higher than or equal to the threshold speed. The threshold speed is, for example, 30 to 50% inclusive of the maximum speed of the vehicle 100.

When the electric motor 61 is under constant torque control, the electrical current through the electric motor 61 is at the maximum. Until the vehicle 100 reaches the threshold speed, the electric motor 61 undergoes asynchronous pulse width modulation (PMW) control with the switching frequency of the inverter 13 of about 1 kHz, for example, independently of the rotational speed of the electric motor 61. This increases the switching loss of the inverter 13. When the vehicle 100 reaches the threshold speed, the electric motor 61 undergoes PWM control in a synchronous pulse mode based on the switching frequency corresponding to the rotational speed of the electric motor 61. The switching loss of the inverter 13 is thus smaller than during asynchronous PWM control.

In other words, the components of the inverter 13 start generating more heat when the vehicle 100 is at low speed, and the components of the converter 12 start generating more heat when the vehicle 100 is at high speed. As illustrated in FIG. 5, the U-phase circuit 14 and the V-phase circuit 15 in the converter 12 are mounted in the first central portion 41*a* to have the V-phase circuit 17 in the inverter 13 between the U-phase circuit 14 and the V-phase circuit 15 in the X-axis direction. The second heat transfer members 25 further extend in the X-axis direction on the base 21. Thus, although the converter 12 and the inverter 13 start generating more heat at different times, heat is diffused in the base 21 in the X-axis direction and then transferred to each of the first heat transfer members 23 arranged in the X-axis direction, thus efficiently cooling the electronic components 40.

In the electronic device 1 according to the embodiment as described above, the electronic components 40 mounted in the first central portion 41*a* have a greater amount of total heat generation than the electronic components 40 mounted in the first end portions 41*b* and 41*c*. The heat dissipation members 22 attached to the second central portion 42*a* have a larger total surface area than the heat dissipation members 22 attached to the second end portions 42*b* and 42*c*. In other words, the electronic components 40 that generate more heat are at positions corresponding to the heat dissipation members 22 with higher cooling performance. The electronic device 1 can thus have high performance in cooling the electronic components 40.

The improved performance in cooling the electronic components 40 reduces the temperature rise in the electronic components 40, extends the service life of the electronic components 40, and reduces the failure rate of the electronic components 40.

With the electronic components 40 that start generating more heat at different times arranged in the X-axis direction and the second heat transfer members 25 extending in the X-axis direction, heat is transferred to the first heat transfer members 23 arranged in the X-axis direction. This structure efficiently cools the electronic components 40.

Figure 7:
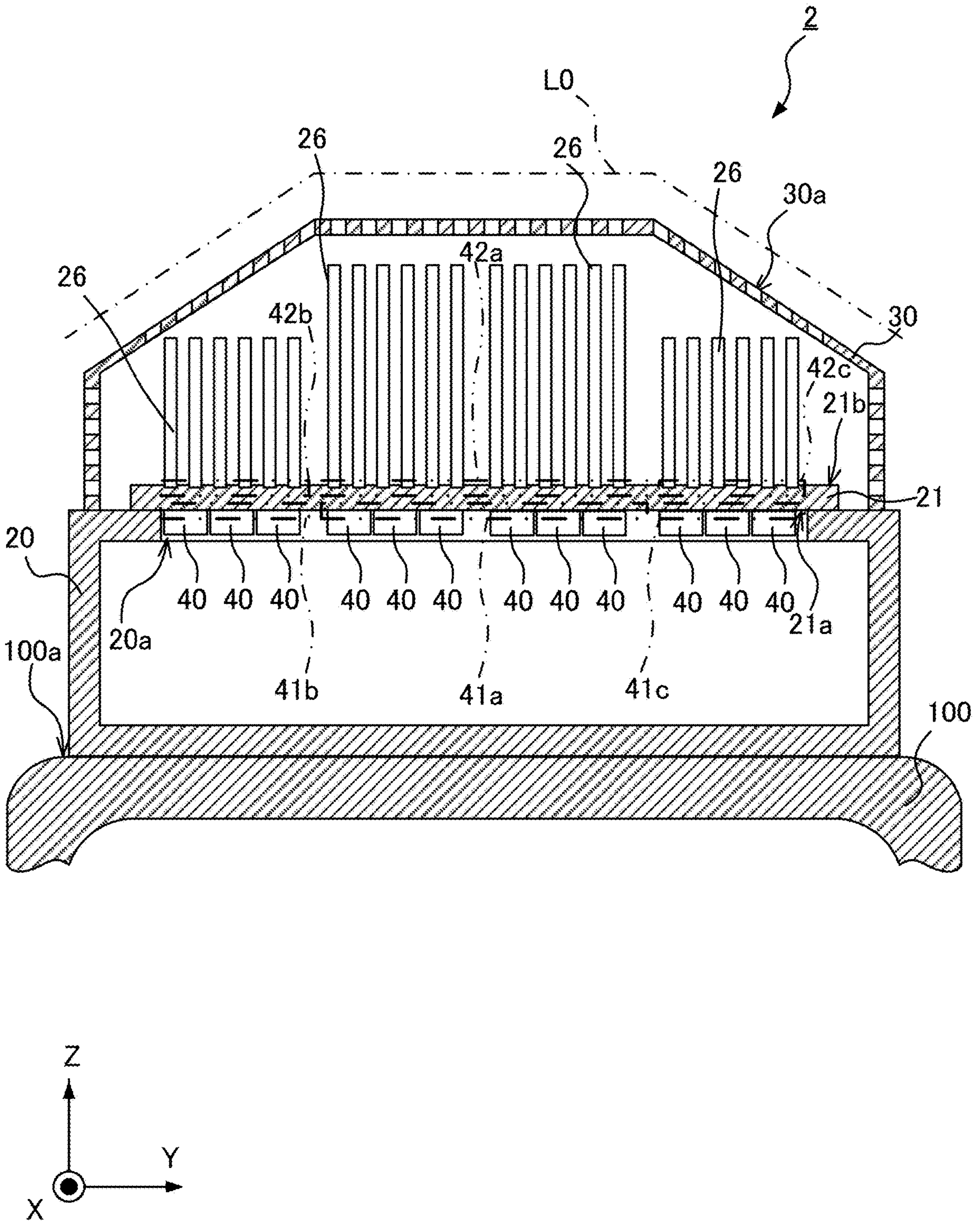
FIG. 7 is a cross-sectional view of an electronic device according to a modification of the embodiment.

The present disclosure is not limited to the above embodiments. The heat dissipation members 22 may have any structure that can dissipate heat transferred from the electronic components 40 through the base 21 into ambient air. FIG. 7 illustrates an example of an electronic device 2 that includes heat dissipation members with a different structure. The electronic device 2 has the same circuit configuration as the electronic device 1. The electronic device 2 illustrated in FIG. 7 includes multiple fins 26 as the heat dissipation members. Each fin 26 is attached to the second main surface 21*b* of the base 21 with an attaching method such as adhesive bonding, welding, or brazing. Each fin 26 is a flat plate of a material with high thermal conductivity, for example, metal such as iron or aluminum, fine ceramics, or graphite.

The fins 26 attached to the second central portion 42*a* are longer than the fins 26 attached to the second end portions 42*b* and 42*c* in the Z-axis direction. When each fin 26 has the same length in the X-axis direction, the fin 26 attached to the second central portion 42*a* has a larger surface area than the fin 26 attached to the second end portion 42*b* or 42*c*. The fins 26 in the second central portion 42*a* thus have higher cooling performance than the fins 26 in the second end portions 42*b* and 42*c*.

As another example, each first heat transfer member 23 may be a rod-like member of a material with high thermal conductivity, for example, metal such as iron or aluminum, fine ceramics, or graphite. In this case, each second heat transfer member 25 may be a rod-like member of a material with high thermal conductivity, for example, metal such as iron or aluminum, fine ceramics, or graphite. Each first heat transfer member 23 may be attached to the corresponding second heat transfer member 25 with an attaching method such as adhesive bonding, welding, or brazing.

The shape of each first heat transfer member 23 is not limited to the above example. In an example, each first heat transfer member 23 may be a U- or L-shaped heat pipe partially received in a groove on the second main surface 21*b*.

The first central portion 41*a* and the first end portions 41*b* and 41*c* may not be the portions divided in the manner in the above example. For example, the first threshold may be defined based on the distance from the first main surface 21*a* to the vehicle limit L0 at the center in the width direction and the distance from the first main surface 21*a* to the vehicle limit L0 at the end in the width direction. More specifically, the first threshold may be defined as the average of the distance from the first main surface 21*a* to the vehicle limit L0 at the center in the width direction and the distance from the first main surface 21*a* to the vehicle limit L0 at the end in the width direction.

The second central portion 42*a* and the second end portions 42*b* and 42*c* may not be the portions divided in the manner in the above example. For example, the second threshold may be defined based on the distance from the second main surface 21*b* to the vehicle limit L0 at the center in the width direction and the distance from the second main surface 21*b* to the vehicle limit L0 at the end in the width direction. More specifically, the second threshold value may be defined as the average of the distance from the second main surface 21*b* to the vehicle limit L0 at the center of the width direction and the distance from the second main surface 21*b* to the vehicle limit L0 at the end in the width direction.

Figure 8:
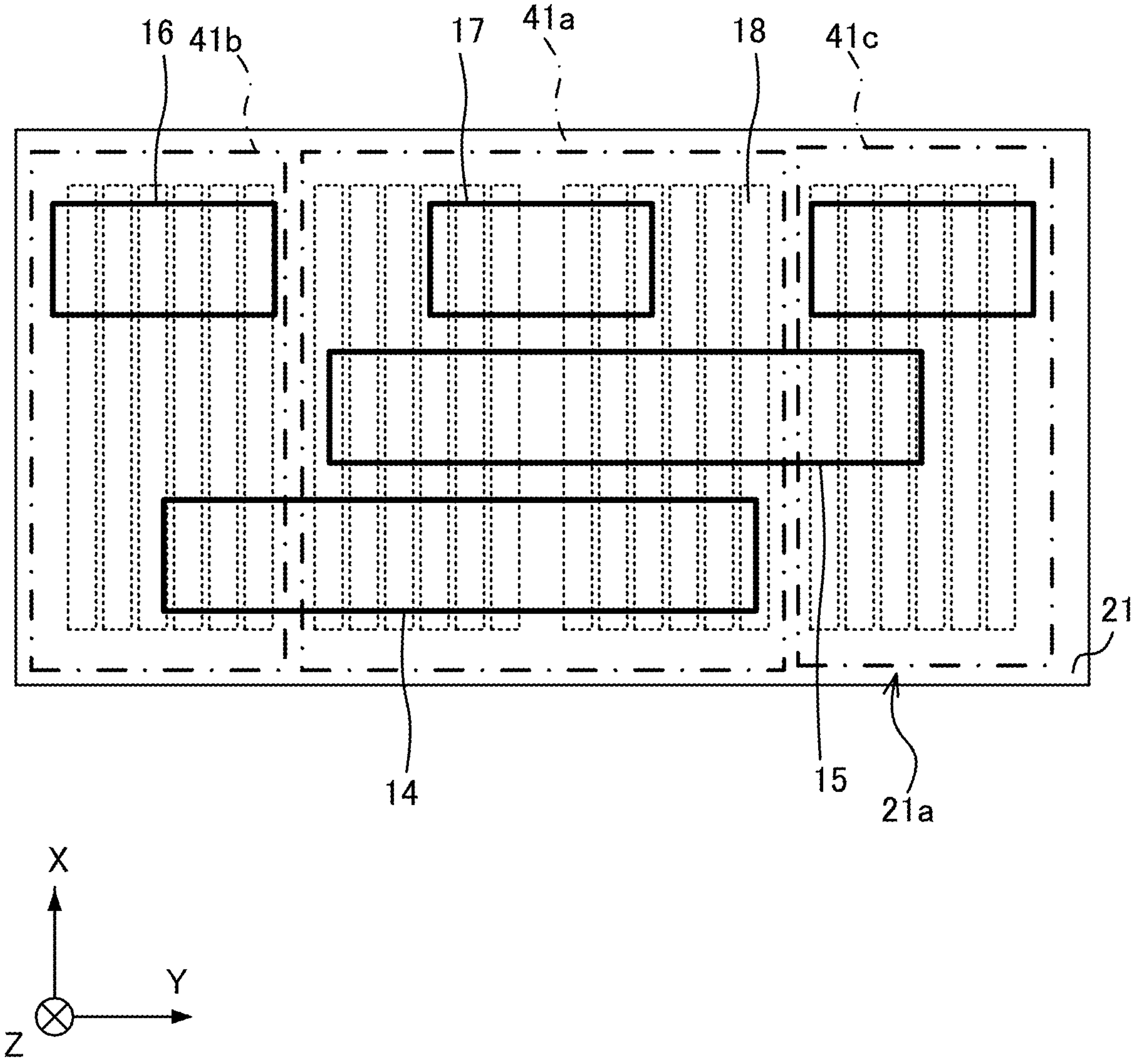
FIG. 8 is a diagram of the electronic components, illustrating another example arrangement on the base in the embodiment.

The electronic components 40 may be arranged in any manner other than described in the above example when the electronic components 40 mounted in the first central portion 41*a* corresponding to the second central portion 42*a* with the heat dissipation members 22 having higher cooling performance generate more heat than the electronic components 40 mounted in the first end portions 41*b* and 41*c*. In an example illustrated in FIG. 8, the U-phase circuit 16, the V-phase circuit 17, and the W-phase circuit 18 in the inverter 13 may be arranged in the Y-axis direction at the end of the first main surface 21*a* in the positive X-axis direction. The U-phase circuit 14 in the converter 12 is mounted on the first main surface 21*a* across the first end portion 41*b* and the first central portion 41*a*. The V-phase circuit 15 in the converter 12 is mounted on the first main surface 21*a* across the first central portion 41*a* and the first end portion 41*c*. Thus, more electronic components 40 may be mounted in the first central portion 41*a* than in the first end portions 41*b* and 41*c* to maximize the cooling performance of the heat dissipation members 22 to cool the electronic components 40.

Figure 9:
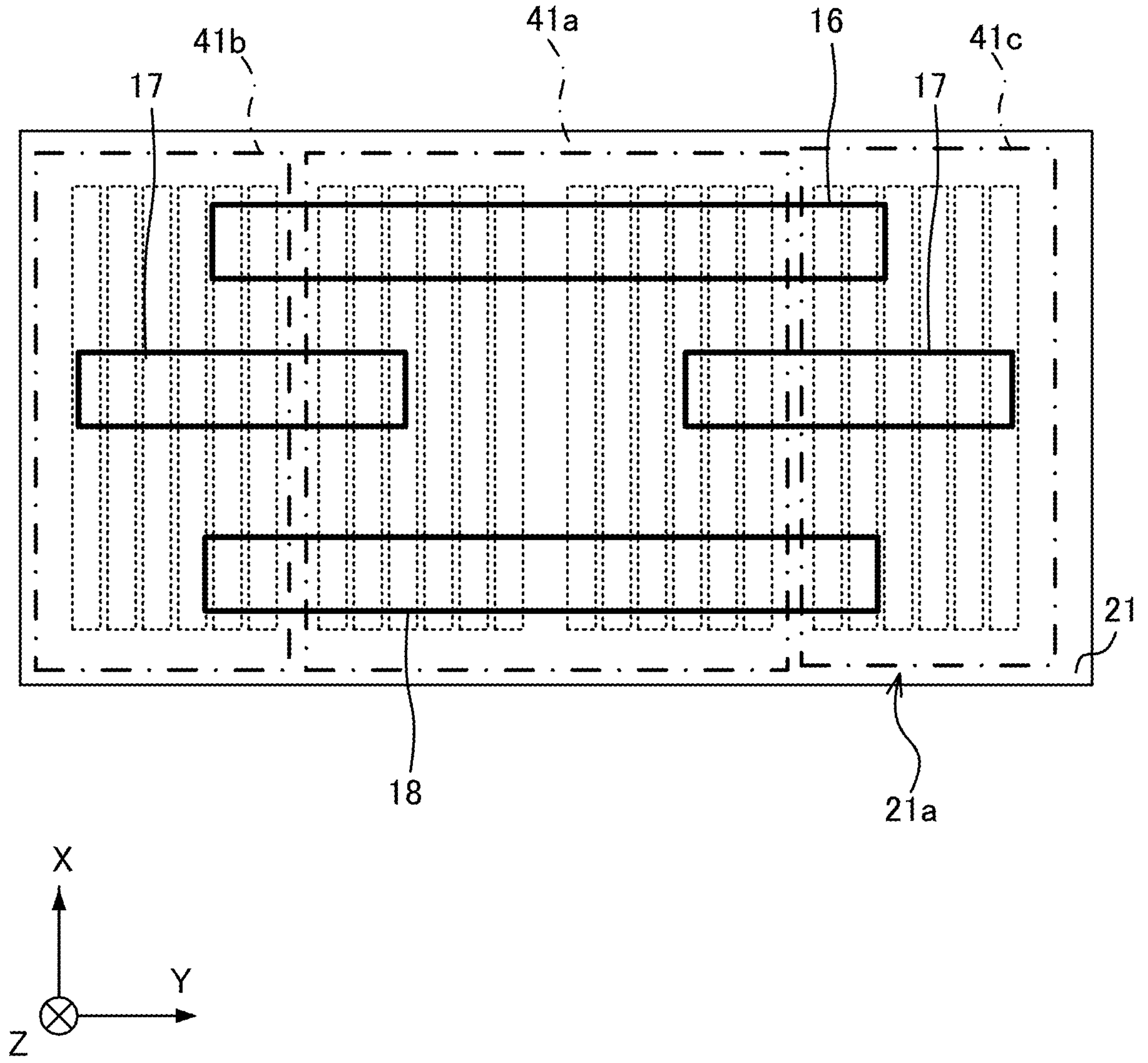
FIG. 9 is a diagram of the electronic components, illustrating another example arrangement on the base in the embodiment.

The circuit configuration of the electronic device 1 or 2 is not limited to the above examples and may be modified as appropriate. In an example, the electronic device 1 or 2 may include no converter 12 and simply include the capacitors C1 and C2 and the inverter 13. In this case, the electronic device 1 or 2 is a power converter that converts DC input power to three-phase AC power. As illustrated in FIG. 9, for example, the U-phase circuit 16 and the W-phase circuit 18 may be mounted at the center of the first main surface 21*a* in the Y-axis direction, and the V-phase circuit 17 may include multiple V-phase circuits 17 distributed at the ends of the first main surface 21*a* in the Y-axis direction.

In another example, the electronic device 1 or 2 may further include an inverter connected to the capacitors C1 and C2 in parallel with the inverter 13 to supply power to other loads. The inverter may supply power to, for example, loads such as an air conditioner, lighting equipment, and a door open-close device. The electronic components 40 in the inverter are mounted on the first main surface 21*a* in the same manner as the converter 12 and the inverter 13.

The circuit configuration of the converter 12 and the inverter 13 is not limited to the above example. Any number of switching elements SW1, SW2, SW3, SW4, and SW5 may be used.

The electronic device 1 or 2 may be installed in a recess on the roof 100*a* of the vehicle 100. In this case, the heat dissipation members 22 preferably have the vertically upper ends above the roof 100*a* in the vertical direction.

The housing 20 may be in any shape that can accommodate the electronic components 40 and can be attached to the roof 100*a*. In an example, the vertically upper surface of the housing 20 may be inclined with respect to the horizontal plane with the vehicle 100 located horizontally.

The base 21 may be a plate-like member with a curved surface protruding away from the housing 20. In this case, the heat dissipation members 22 may extend vertically upward with the vehicle 100 located horizontally.

The base 21 may be a single plate-like member as in the above embodiment, or may include multiple plate-like members joined together.

The electronic components mounted on the base 21 are not limited to the switching elements SW1, SW2, SW3, SW4, and SW5 and the diodes D1, D2, D3, D4, and D5, but may be any electronic components in the electronic device 1 or 2, for example, a thyristor, a diode, and a resistor accommodated in the housing 20.

The first heat transfer members 23 and the second heat transfer members 25 may each have a circular or elongated circular cross section perpendicular to the direction in which the first and second heat transfer members 23 and 25 extend. The elongated circular shape is acquired by deforming a circle to narrow a part of the dimension, and includes an ellipse, a streamline shape, and an oval. The oval refers to an outline of perimeters of two circles with the same diameter connected with two straight lines.

The orientation of the fins 24 attached to the first heat transfer members 23 is not limited to the above example. In an example, the fins 24 may be attached to the first heat transfer members 23 with the main surfaces inclined with respect to the horizontal plane. The fins 24 inclined with respect to the second main surface 21*b* allow air heated with heat transferred from the fins 24 to move vertically upward along the fins 24 smoothly, thus improving the cooling performance.

Each fin 24 may be formed from the same material, or at least one fin 24 may be formed from a material different from the material of the other fins 24. When at least one fin 24 is formed from a material different from the material of the other fins 24, the fin 24 has thermal conductivity different from the thermal conductivity of the other fins 24. In an example, the fins 24 located in a vertically upper portion preferably have thermal conductivity higher than the thermal conductivity of the fins 24 located in a vertically lower portion. For example, the fins 24 located in the vertically upper portion may be formed from copper, and the fins 24 located in the vertically lower portion may be formed from aluminum.

In another example, the fins 24 attached to the first heat transfer members 23 attached to the second central portion 42*a* preferably have higher thermal conductivity than the fins 24 attached to the first heat transfer members 23 attached to the second end portions 42*b* and 42*c*.

Any number of fins 24 in any shape may be arranged in any manner other than in the above example. In an example, each fin 24 may be a plate-like member with a curved surface. In another example, each fin 24 may have a different shape. In another example, the multiple fins 24 may be arranged in the X-axis direction and the Y-axis direction. With the fins 24 arranged in the X-axis direction, air heated with heat transferred from the fins 24 flows vertically between the fins 24 adjacent to one another in the X-axis direction when the vehicle 100 is stopped. Thus, the electronic device 1 or 2 has higher natural cooling performance.

The second heat transfer members 25 may be partially received in a groove on the second main surface 21*b* of the base 21 and attached to the second main surface 21*b* in a manner partially exposed. In this case, each first heat transfer member 23 may be attached to the corresponding second heat transfer member 25 with an attaching method such as welding, or brazing and attached to the second main surface 21*b* through the second heat transfer member 25.

The electronic device 1 or 2 may further include a heat transfer member extending in the Y-axis direction and is embedded in the base 21. This structure diffuses heat in the base 21 in the Y-axis direction as well as in the X-axis direction and then transfers the heat to the first heat transfer members 23.

The cover 30 may be in any shape that covers the heat dissipation members 22 and allows air to flow inside. In an example, the cover 30 may have a vertically upper surface that is curved. In another example, the cover 30 may have a vertically upper surface that is flat. The cover 30 preferably has a shape that maximizes the internal space below the vehicle limit.

When other devices are located around the electronic device 1 or 2, the fins 24 located in the vertically upper portion can come in contact with air flowing from outside more easily than the fins 24 located in the vertically lower portion. Similarly, a vertically upper portion of each fin 24 can come in contact with air flowing from outside more easily than a vertically lower portion of each fin 24. For example, when the fins 24 located in the vertically upper portion have higher thermal conductivity and the fins 24 with the vertically upper ends located higher than the vertically upper ends of the other fins 24 have higher thermal conductivity, the electronic device 1 or 2 can have higher cooling performance.

The electronic device 1 or 2 may be installable on a DC feeding railway vehicle, rather than on an AC feeding railway vehicle. The electronic device 1 or 2 may be installable on any movable body that creates passing air, such as a trolley bus or a streetcar, rather than the railway vehicle.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1,2 Electronic device
1*a*, 1*b* Input terminal
11 Transformer
12 Converter
13 Inverter
14, 16 U-phase circuit
15, 17 V-phase circuit
18 W-phase circuit
20 Housing
20*a* Opening
21 Base
21*a* First main surface
21*b* Second main surface
22 Heat dissipation member
23 First heat transfer member
24, 26 Fin
25 Second heat transfer member
30 Cover
30*a*, 30*b* Vent
40 Electronic component
41*a* First central portion
41*b*, 41*c* First end portion
42*a* Second central portion
42*b*, 42*c* Second end portion
61 Electric motor
100 Vehicle
100*a* Roof
C1, C2 Capacitor
D1, D2, D3, D4, D5 Diode
L0 Vehicle limit
L1, L2, L3 Distance
SW1, SW2, SW3, SW4, SW5 Switching element

The invention claimed is:

1. An electronic device, comprising:

a housing installable on a roof of a vehicle, the housing having an opening in a vertically upper portion of the housing and accommodating a plurality of electronic components that generate heat when energized;

a base being heat-transferable, the base having a first main surface on which the plurality of electronic components are mounted, the base being attached to the housing with the first main surface covering the opening in the housing; and a plurality of heat dissipation members attached to a second main surface of the base opposite to the first main surface to dissipate, into ambient air, heat transferred from the plurality of electronic components through the base; wherein the plurality of heat dissipation members include a plurality of first heat transfer members extending away from the second main surface and a plurality of fins attached to the plurality of first heat transfer members, the plurality of electronic components include electronic components mounted in a first central portion of the first main surface and electronic components mounted in first end portions of the first main surface, the first central portion has a distance greater than or equal to a first threshold to a vehicle limit on the roof of the vehicle, the first end portions are located with the first central portion between the first end portions in a width direction of the vehicle and have a distance less than the first threshold to the vehicle limit, and the electronic components in the first central portion have a greater amount of total heat generation than the electronic components in the first end portions, and the plurality of first heat transfer members and the plurality of fins attached to the plurality of first heat transfer members include first heat transfer members and fins attached to a second central portion of the second main surface and first heat transfer members and fins attached to second end portions of the second main surface, the second central portion has a distance greater than or equal to a second threshold to the vehicle limit, the second end portions are located with the second central portion between the second end portions in the width direction and have a distance less than the second threshold to the vehicle limit, and the first heat transfer members and fins attached to the second central portion have a larger total surface area than the first heat transfer members and fins attached to the second end portions.

2. The electronic device according to claim 1, wherein the plurality of heat dissipation members include the plurality of first heat transfer members attached to the second main surface and extending away from the second main surface to transfer heat away from the second main surface, and the plurality of fins attached to the plurality of first heat transfer members with main surfaces of the plurality of fins extending along the second main surface, and the plurality of first heat transfer members include first heat transfer members attached to the second central portion and first heat transfer members attached to the second end portions, and the first heat transfer members attached to the second central portion are longer than the first heat transfer members attached to the second end portions in a direction in which the plurality of first heat transfer members extend.

3. The electronic device according to claim 2, wherein the plurality of fins include more fins attached to the first heat transfer members attached to the second central portion than to the first heat transfer members attached to the second end portions.

4. An electronic device, comprising:

a housing installable on a roof of a vehicle, the housing having an opening in a vertically upper portion of the housing and accommodating a plurality of electronic components that generate heat when energized;

a base being heat-transferable, the base having a first main surface on which the plurality of electronic components are mounted, the base being attached to the housing with the first main surface covering the opening in the housing; and a plurality of heat dissipation members attached to a second main surface of the base opposite to the first main surface to dissipate, into ambient air, heat transferred from the plurality of electronic components through the base; wherein the plurality of electronic components include electronic components mounted in a first central portion of the first main surface and electronic components mounted in first end portions of the first main surface, the first central portion has a distance greater than or equal to a first threshold to a vehicle limit on the roof of the vehicle, the first end portions are located with the first central portion between the first end portions in a width direction of the vehicle and have a distance less than the first threshold to the vehicle limit, and the electronic components in the first central portion have a greater amount of total heat generation than the electronic components in the first end portions, the plurality of heat dissipation members include a plurality of fins, and the plurality of fins are attached to the second main surface with main surfaces of the plurality of fins extending along a travel direction of the vehicle and arranged in the width direction, and the plurality of fins include fins attached to a second central portion of the second main surface and fins attached to second end portions of the second main surface, the second central portion has a distance greater than or equal to a second threshold to the vehicle limit, the second end portions are located with the second central portion between the second end portions in the width direction and have a distance less than the second threshold to the vehicle limit, and the fins attached to the second central portion have a larger total surface area than the fins attached to the second end portions.

5. The electronic device according to claim 1, wherein a number of the electronic components mounted in the first central portion is greater than a number of the electronic components mounted in the first end portions.

6. The electronic device according to claim 1, wherein the plurality of electronic components include a plurality of first electronic components and a plurality of second electronic components, and the plurality of second electronic components generate more heat at a time different from a time at which each of the plurality of first electronic components generates more heat, and the plurality of first electronic components and the plurality of second electronic components are mounted on the base at positions adjacent to each other in a travel direction of the vehicle.

7. The electronic device according to claim 6, wherein the plurality of first electronic components include a plurality of switching elements included in a converter to convert supplied alternating current power to direct current power and output the direct current power, and the plurality of second electronic components include a plurality of switching elements included in an inverter to convert the direct current power output by the converter to alternating current power and output the alternating current power.

8. The electronic device according to claim 7, wherein at least two of the plurality of first electronic components are mounted in the first central portion at positions to have a second electronic component of the plurality of second electronic components between the at least two of the plurality of first electronic components in the travel direction of the vehicle, and another of the plurality of first electronic components is mounted in a first end portion of the first end portions at a position adjacent to a second electronic component of the plurality of second electronic components in the travel direction of the vehicle.

9. The electronic device according to claim 1, further comprising:

a plurality of second heat transfer members extending in a travel direction of the vehicle and attached to the base.

10. The electronic device according to claim 9, wherein the plurality of second heat transfer members is attached to the second main surface of the base.

11. The electronic device according to claim 1, wherein the first central portion has an area substantially equal to a total area of the first end portions.

12. An electronic device, comprising:

a housing installable on a roof of a vehicle, the housing having an opening in a vertically upper portion of the housing and accommodating a plurality of electronic components that generate heat when energized;

a base being heat-transferable, the base having a first main surface on which the plurality of electronic components are mounted, the base being attached to the housing with the first main surface covering the opening in the housing; and a plurality of heat dissipation members attached to a second main surface of the base opposite to the first main surface to dissipate, into ambient air, heat transferred from the plurality of electronic components through the base; wherein the plurality of electronic components include electronic components mounted in a first central portion of the first main surface and electronic components mounted in first end portions of the first main surface, the first central portion has a distance greater than or equal to a first threshold to a vehicle limit on the roof of the vehicle, the first end portions are located with the first central portion between the first end portions in a width direction of the vehicle and have a distance less than the first threshold to the vehicle limit, and the electronic components in the first central portion have a greater amount of total heat generation than the electronic components in the first end portions, the plurality of heat dissipation members include heat dissipation members attached to a second central portion of the second main surface and heat dissipation members attached to second end portions of the second main surface, the second central portion has a distance greater than or equal to a second threshold to the vehicle limit, the second end portions are located with the second central portion between the second end portions in the width direction and have a distance less than the second threshold to the vehicle limit, and the heat dissipation members attached to the second central portion have a larger total surface area than the heat dissipation members attached to the second end portions, and the first central portion has an area substantially equal to a total area of the first end portions.

13. The electronic device according to claim 1, wherein the second central portion has an area substantially equal to a total area of the second end portions.

* * * * *